(12) United States Patent
Takatani

(10) Patent No.: US 8,368,168 B2
(45) Date of Patent: Feb. 5, 2013

(54) III-V-GROUP COMPOUND SEMICONDUCTOR DEVICE

(75) Inventor: Kunihiro Takatani, Osaka (JP)

(73) Assignee: Sharp Kabushiki Kaisha, Osaka-Shi, Osaka ( * ) Notice: Subject to any disclaimer, the term of this patent is extended or adjusted under 35 U.S.C. 154(b) by 190 days.

(21) Appl. No.: 12/656,481

(22) Filed: Feb. 1, 2010

(65) Prior Publication Data
US 2010/0193839 A1 Aug. 5, 2010

(30) Foreign Application Priority Data
Feb. 3, 2009 (JP) ................................. 2009-022950

(51) Int. Cl.
*H01L 29/40* (2006.01)

(52) U.S. Cl. ........ 257/485; 257/192; 257/194; 257/471; 257/472; 257/E21.407; 438/167; 438/172

(58) Field of Classification Search .................. 257/192, 257/194, 471, 472, 485, E29.248, E29.252, 257/E21.403, E21.407; 438/167, 172
See application file for complete search history.

(56) References Cited

U.S. PATENT DOCUMENTS

| | | | |
|---|---|---|---|
| 6,316,793 B1 * | 11/2001 | Sheppard et al. ............. 257/103 |
| 6,756,262 B1 | 6/2004 | Nakamura et al. | |
| 7,026,665 B1 * | 4/2006 | Smart et al. .................... 257/190 |
| 7,504,684 B2 * | 3/2009 | Kanaya .......................... 257/300 |
| 7,728,356 B2 * | 6/2010 | Suh et al. ....................... 257/194 |
| 2004/0004793 A1 | 1/2004 | Mikawa et al. | |
| 2005/0221628 A1 | 10/2005 | Tanaka et al. | |
| 2006/0180894 A1 * | 8/2006 | Kumura et al. ............... 257/532 |
| 2010/0034231 A1 * | 2/2010 | Fukuda et al. ............. 372/49.01 |
| 2010/0270591 A1 * | 10/2010 | Ahn ............................... 257/194 |
| 2011/0263102 A1 * | 10/2011 | Heikman et al. .............. 438/478 |

FOREIGN PATENT DOCUMENTS

| | | |
|---|---|---|
| JP | 2001-144266 | 5/2001 |
| JP | 2004-40005 | 2/2004 |
| JP | 2005-286135 | 10/2005 |
| JP | 2008-305993 | 12/2008 |

OTHER PUBLICATIONS

"110W AlGaN/GaN Heterojunction FET on Thinned Sapphire," Ando et al., Technical Report of IEICE, ED2001-185, pp. 7-12 (with English translation).

* cited by examiner

*Primary Examiner* — Eduardo A Rodela
(74) *Attorney, Agent, or Firm* — Harness, Dickey & Pierce, P.L.C.

(57) ABSTRACT

A III-V-group compound semiconductor device includes a substrate, a channel layer provided over the substrate, a barrier layer provided on the channel layer so as to form a hetero-interface, a plurality of electrodes provided on the barrier layer, an insulator layer provided to cover an entire upper surface of the barrier layer except for at least partial regions of the electrodes, and a hydrogen-absorbing layer stacked on the insulator layer or an integrated layer in which an hydrogen-absorbing layer is integrated with the insulator layer.

13 Claims, 3 Drawing Sheets

III-V-GROUP COMPOUND
SEMICONDUCTOR DEVICE

This nonprovisional application is based on Japanese Patent Application No. 2009-022950 filed on Feb. 3, 2009 with the Japan Patent Office, the entire contents of which are hereby incorporated by reference.

BACKGROUND OF THE INVENTION

1. Field of the Invention

The present invention is related to an improvement in a III-V-group compound semiconductor device and more particularly to an improvement in a III-V-group compound semiconductor device including a channel layer and a barrier layer that form a hetero-interface.

2. Description of the Background Art

In the case that III-group nitride semiconductors as typified by GaN, AlGaN, InGaN, and the like are used for electronic devices, it is expected that the excellent properties of those materials can realize good device properties such as a high withstand voltage, a high speed operation, a high heat resistance, a low on-resistance, and the like. Therefore, electronic devices are now being developed with using III-group nitride semiconductors instead of the Si material. Particularly regarding a field effect transistor (FET), the on-resistance of the FET can be reduced with a two-dimensional electron gas formed in the vicinity of a hetero junction interface of AlGaN/GaN. Like this, there have been proposed various device structures that utilize hetero junction interfaces.

FIG. 3 is a schematic cross-sectional view of a conventional hetero junction type field effect transistor (HFET) that utilizes III-group nitride semiconductors (refer to Technical Report of IEICE, ED2001-185, pages 7-12). This HFET is a planar-type device and includes a buffer layer (or crystal-nucleation layer) 303, a GaN channel layer 304 and a AlGaN barrier layer 305 stacked in this order on a substrate 302 of sapphire, Si, SiC, or the like. Formed on AlGaN barrier layer 305 are a source electrode 306, a gate electrode 307 and a drain electrode 308. Between source electrode 306 and drain electrode 308, the upper surface of barrier layer 305 and the upper surface of gate electrode 307 are covered with a protective layer formed of an insulator film of SiN or the like.

When the above-described III-group nitride semiconductor HFET is operated for a long-term period, there arise a problem that the on-resistance of the HFET device is increased gradually as compared to the initial state of the device and then the source-drain current is decreased gradually.

The so-called current collapse phenomenon is well known regarding the III-group nitride semiconductor HFET, in which the sheet carrier density in the channel region is decreased when the source-drain voltage is applied, as compared to the resting state of the device. In order to suppress this phenomenon, it has been attempted to make protective layer 309 (see FIG. 3) for example have a function for suppressing the current collapse. Even if such a countermeasure is provided, however, it is difficult to avoid the problem that the drain current is decreased as mentioned above.

In order to investigate the cause of this problem, the present inventor has conducted the SIMS (secondary ion mass spectroscopy) on an HFET device that has been deteriorated in its properties. As a result, it has been found that the concentration of hydrogen atoms becomes higher in the semiconductor layers, particularly in a region from the upper surface side of the AlGaN barrier layer to the vicinity of the hetero junction interface and GaN channel layer, in the deteriorated HFET device as compared with in a non-deteriorated device.

It has also been found by the SIMS that hydrogen atoms are contained at a high level concentration in the order of $10^{20}/cm^3$ inside the insulator film covering the upper surface of the device. While the insulator film analyzed at this time was deposited by radio-frequency sputtering, there is a sufficient possibility that hydrogen atoms are contained in the order of $10^{19}$-$10^{21}/cm^3$ depending on the deposition condition in the insulator film deposited even by using one of the other deposition methods such as an electron beam evaporation method and a CVD (chemical vapor deposition) method that are often used in processes for forming electronic devices. This hydrogen concentration level in the order of $10^{20}/cm^3$ is higher with about two digits as compared to the concentration (in the order of $10^{18}/cm^3$) of hydrogen atoms contained in the III-nitride crystal layers such as the AlGaN barrier layer and GaN channel layer.

Therefore, it is presumed that hydrogen atoms migrate or diffuse from the insulator film containing hydrogen atoms at a high concentration to the interior of the HFET device under the condition that a strong electric field is generated toward the substrate side of the device when the device is in its operation state. At this time, defects due to dissociation of hydrogen bonds in the insulator film are increased and then electric charges are localized at those defects. As a result, on a principle similar to the well-known current collapse phenomenon, the electron concentration is relatively reduced in the two-dimensional electron gas (hereinafter referred to as "2DEG") generated in the vicinity of the hetero-interface of the AlGaN barrier layer/GaN channel layer and then the resistance component is increased in the current channel of the HFET. It is thus presumed that this is the model in which the current decreases between the source and drain.

SUMMARY OF THE INVENTION

This invention has been made to solve the problem as described above and an object of the invention is to provide an improved III-V-group compound semiconductor device in which the on-resistance does not increase during a long-term period of the device operation.

A III-V-group compound semiconductor device according to the present invention includes a substrate, a channel layer provided over the substrate, a barrier layer provided on the channel layer so as to form a hetero-interface, a plurality of electrodes provided on the barrier layer, an insulator layer provided to cover an entire upper surface of the barrier layer except for at least partial regions of the electrodes, a hydrogen-absorbing layer stacked on the insulator layer or an integrated layer in which an hydrogen-absorbing layer is integrated with the insulator layer.

Here, each of the channel layer and barrier layer is preferably formed with III-V-group compound semiconductor and more preferably formed with III-group nitride semiconductor. It is also preferable that a metal element contained in the hydrogen-absorbing layer has a smaller heat of formation of a hydride as compared to a metal element contained in the insulator layer.

More specifically, the insulator layer preferably includes a dielectric selected from a group consisting of Si, $Si_3N_4$, $SiO_2$, $TiO_2$, $ZrO_2$, $HfO_2$, $MgF_2$, $CaF_2$, $SrF_2$, $BaF_2$, $Al_2O_3$, $V_2O_5$, $Nb_2O_5$, $Ta_2O_5$, AlON, and ZnO. The hydrogen-absorbing layer is preferably formed of one of a metal oxide, a metal nitride and a metal fluoride containing a metal element selected from a group consisting of Li, Na, Mg, K, Ca, Sc, Ti, Rb, Sr, Y, Zr, Cs, Ba, La, Hf, Ta, Ce, Pr, Nd, Sm, Eu, Gd, Tb, Dy, Ho, and Er.

It is preferable that the insulator layer contains hydrogen atoms at a concentration of $10^{18}/cm^3$ or more. It is also preferable that the hydrogen-absorbing layer has a thickness of 1 nm or more.

The present invention can provide an improved III-V-group compound semiconductor device in which it is possible to suppress decrease of the 2DEG concentration in the channel layer adjacent to the hetero-interface and then possible to suppress increase of the on-resistance during a long-term period of operation.

More specifically, since the hydrogen-absorbing layer is provided on the insulator layer covering the surface of the III-V-group compound semiconductor device according to the present invention, hydrogen atoms contained in the insulator layer are attracted and absorbed to the hydrogen-absorbing layer, whereby making it possible to suppress the hydrogen diffusion toward the interior of the semiconductor device. Therefore, in the case that the present invention is applied to an HFET device including a GaN channel layer and an AlGaN barrier layer for example, it becomes possible to prevent the 2DEG formed in the vicinity of the hetero-junction interface between the channel layer and barrier layer from being compensated by local charges in the insulator layer. As a result, it becomes possible to provide III-V-group compound semiconductor device having stable characteristics, in which decrease of the 2DEG concentration and increase of resistance in the current channel can be avoided and then increase of the on-resistance during operation of the HFET device can be suppressed.

The foregoing and other objects, features, aspects and advantages of the present invention will become more apparent from the following detailed description of the present invention when taken in conjunction with the accompanying drawings.

BRIEF DESCRIPTION ON THE DRAWINGS

DESCRIPTION OF THE PREFERRED EMBODIMENTS

Figure 1:
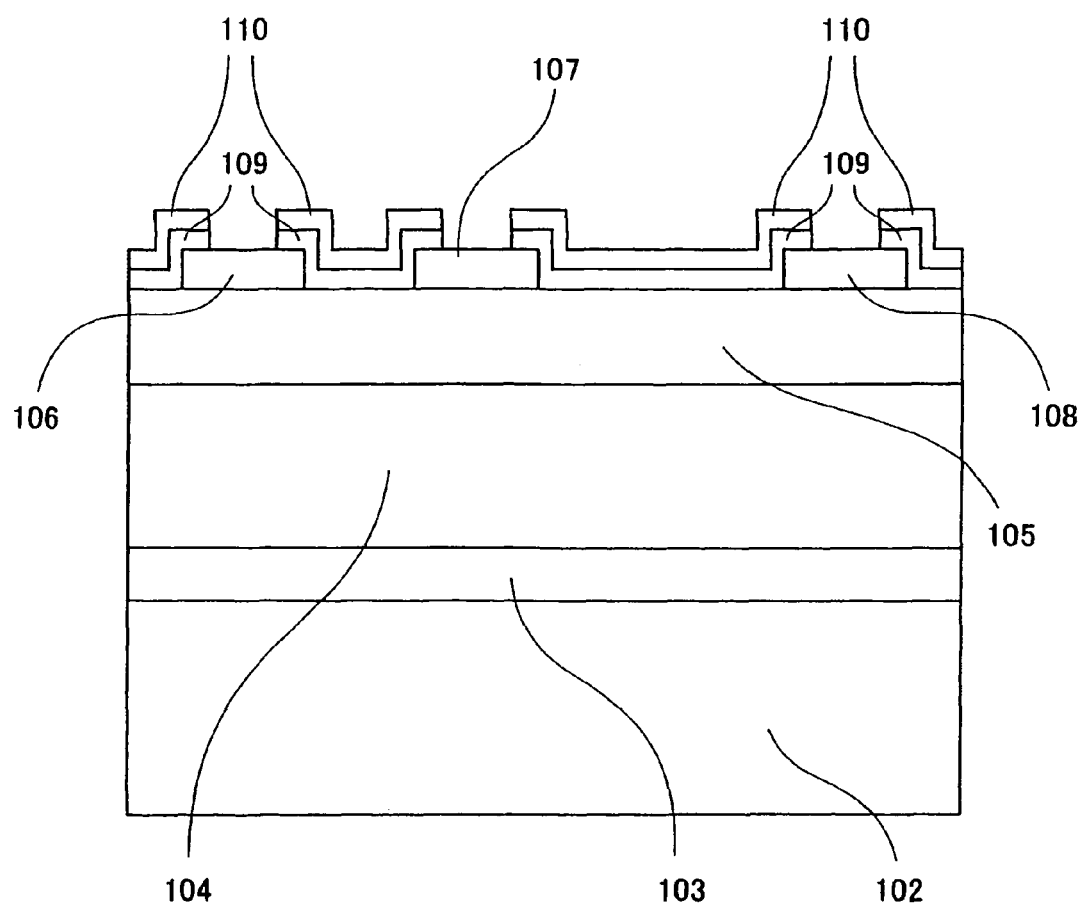
FIG. 1 is a schematic cross-sectional view of an HFET device according to an embodiment of the present invention.

A III-V-group compound semiconductor device includes a channel layer and a barrier layer that are formed of III-group semiconductor. Directly on this barrier layer or on a contact layer formed thereon, there are provided a source electrode, a gate electrode and a drain electrode. An entire or partial upper surface area of the barrier layer, where the electrodes are not formed, is covered with an insulator layer. On the insulator layer, there is provided a hydrogen-absorbing layer containing a metal element for absorbing hydrogen atoms from the insulator layer.

This hydrogen-absorbing layer acts, by attracting and absorbing hydrogen atoms, to prevent hydrogen atoms contained in the insulator layer from migrating or diffusing toward the semiconductor layer side. Therefore, even when a strong electric field is generated in an operation state of the transistor, hydrogen atoms are fixed in the insulator layer and defects involved are not increased, whereby maintaining the electron concentration of the 2DEG formed in the vicinity of the interface between the GaN channel layer and the AlGaN barrier layer. As a result, increase of the resistance of the current channel can be avoided and then the characteristics of the device can be maintained stable without increase of the on-resistance of the whole III-V-group compound semiconductor device.

The III-V-group semiconductor device as above corresponds to various III-V-group semiconductor devices having a structure utilizing the 2DEG in a current path, centering on a field effect transistor.

Incidentally, the insulator layer and hydrogen-absorbing layer may be integrally formed as one integrated layer. In this case, it is preferable that the concentration of the metal element for absorbing hydrogen atoms in the integrated layer is made lower toward the semiconductor layer side. In this case, it is particularly preferable that the concentration of the metal element for absorbing hydrogen atoms is made lower in a gradation manner from the upper surface of the integrated layer toward the semiconductor layer side. With such a constitution, hydrogen atoms contained in the insulator layer are strongly attracted to the side opposite to the semiconductor layer side and then diffusion thereof toward the semiconductor layer side is suppressed.

It is preferable that the metal element contained in the hydrogen-absorbing layer has a smaller heat of formation of a hydride as compared to that contained in the insulator layer. With such a constitution, hydrogen atoms contained in the insulator layer are strongly attracted to the side opposite to the semiconductor layer side and then diffusion thereof toward the semiconductor layer side is suppressed.

More specifically, the insulator layer preferably includes a dielectric selected from a group consisting of Si, $Si_3N_4$, $SiO_2$, $TiO_2$, $ZrO_2$, $HfO_2$, $MgF_2$, $CaF_2$, $SrF_2$, $BaF_2$, $Al_2O_3$, $V_2O_5$, $Nb_2O_5$, $Ta_2O_5$, AlON, and ZnO. It is particularly preferable that $Si_3N_4$, $SiO_2$, $Al_2O_3$, or $Ta_2O_5$ is used for the insulator layer in view of the production process, ability for suppressing the current collapse phenomenon, adhesiveness to the semiconductor layer, and the like.

The hydrogen-absorbing layer is preferably formed of one of a metal oxide, a metal nitride and a metal fluoride containing a metal element selected from a group consisting of Li, Na, Mg, K, Ca, Sc, Ti, Rb, Sr, Y, Zr, Cs, Ba, La, Hf, Ta, Ce, Pr, Nd, Sm, Eu, Gd, Tb, Dy, Ho, and Er.

It is preferable that the hydrogen-absorbing layer has a thickness of 1 nm or more. It should be noted, however, that the hydrogen-absorbing layer causes a hydrogen-absorbing effect even if it is a non-continuous film. The present invention is particularly effective in the case that the insulator layer contains hydrogen atoms at a concentration of $10^{18}/cm^3$ or more.

The present invention is also particularly effective in the case that the III-V-group compound semiconductor device is formed including BN, AlN, InN, GaN, TlN, or a mixed crystal thereof.

Further, The present invention is particularly effective in the case that the III-V-group compound semiconductor device includes a p-type conductivity layer in the structure thereof. In general, Mg is often used as a p-type dopant for the III-group nitride semiconductor. If hydrogen atoms diffuse in the p-type III-group nitride semiconductor, however, Mg as a dopant is compensated by hydrogen atoms and then does not act as an acceptor. As a result, the p-type conductivity is deteriorated whereby deteriorating the functional features of the semiconductor device that are held by the p-type layer included therein. However, such an undesirable result can be avoided with utilizing the present invention.

In the following, III-group nitride semiconductor HFET devices are explained as examples for the III-V-group compound semiconductor device of the present invention. The III-group nitride semiconductor HFET device according to the present invention utilizes nitride semiconductor crystals represented by a formula $B_vAl_wGa_xIn_yTl_zN$ ($0 \leq v \leq 1$, $0 \leq w \leq 1$, $0 \leq x \leq 1$, $0 \leq y \leq 1$, $0 \leq z \leq 1$, $v+w+x+y+z+=1$). Here, B denotes boron, Al denotes aluminum, Ga denotes gallium, In denotes indium, Tl denotes thallium, and N denotes nitrogen, and then v, w, x, y, and z represent content ratios of boron, aluminum, gallium indium, and thallium respectively in the III-group elements. Hereinafter in the present specification, a semiconductor layer formed of a nitride semiconductor crystal represented with a formula $Al_wGa_xN$ ($0<w<1$, $0<x<1$, $w+x=1$) for example is simply referred to as AlGaN layer.

EXAMPLE 1

FIG. 1 shows a schematic cross-sectional view of a III-group nitride semiconductor HFET according to Example 1 of the present invention. For this HFET device, there was used an epitaxial wafer that includes a buffer layer 103, an i-type GaN channel layer 104 of 1 μm thickness, and an undoped AlGaN barrier layer 105 of 30 μm thickness stacked in this order on a high-resistance Si substrate 102. The Al composition ratio in the III-group elements was set to 25% in AlGaN barrier layer 105. A source electrode 106, a gate electrode 107 and a drain electrode 108 were formed on the upper surface of AlGaN barrier layer 105. Each of source electrode 106 and drain electrode 108 is an ohmic electrode having a stacking structure of Hf/Al/Hf/Au, while gate electrode 107 is a WN-based schottky electrode.

A protective insulator layer 109 of $SiO_2$ having a thickness of 150 nm was formed after formation of electrodes 106, 107, 108. This protective layer 109 plays a role in suppressing the current collapse phenomenon. Further, a hydrogen-absorbing layer 110 of $HfO_2$ having a thickness of 10 nm was formed on the upper surface of protective layer 109. Incidentally, an opening through hydrogen-absorbing layer 110 and protective layer 109 was formed on at least a partial upper surface area of each of source electrode 106, gate electrode 107 and drain electrode 108 electrode, as a connection area for a supply line to each electrode.

The metal element Hf included in the hydrogen-absorbing layer has a smaller heat of formation of a hydride as compared with Si included in the insulator layer, and thus hydrogen atoms contained in insulator layer 109 are strongly attracted to hydrogen-absorbing layer 110, whereby diffusion thereof toward the semiconductor layer side is suppressed. Therefore, it is possible to prevent the 2DEG formed in the vicinity of the hetero-junction interface between GaN channel layer 104 and AlGaN barrier layer 105 from being compensated by hydrogen atoms. As a result, decrease of the 2DEG concentration and increase of resistance in the current channel can be avoided and then increase of the on-resistance during operation of the HFET device can be suppressed.

A current test was conducted on the HFET device according to Example 1 as described above. In this test, operation current between the source and drain was monitored under the condition of constant voltage driving in which a gate voltage of 5 V and a drain voltage of 300 V are applied at a high temperature of 150° C.

As a result, the III-group nitride semiconductor HFET of Example 1 showed a source-drain current value varied by a few % from the initial value even after 1000 hours of the constant voltage driving and could stably operate for a long-term period.

EXAMPLE 2

Figure 2:
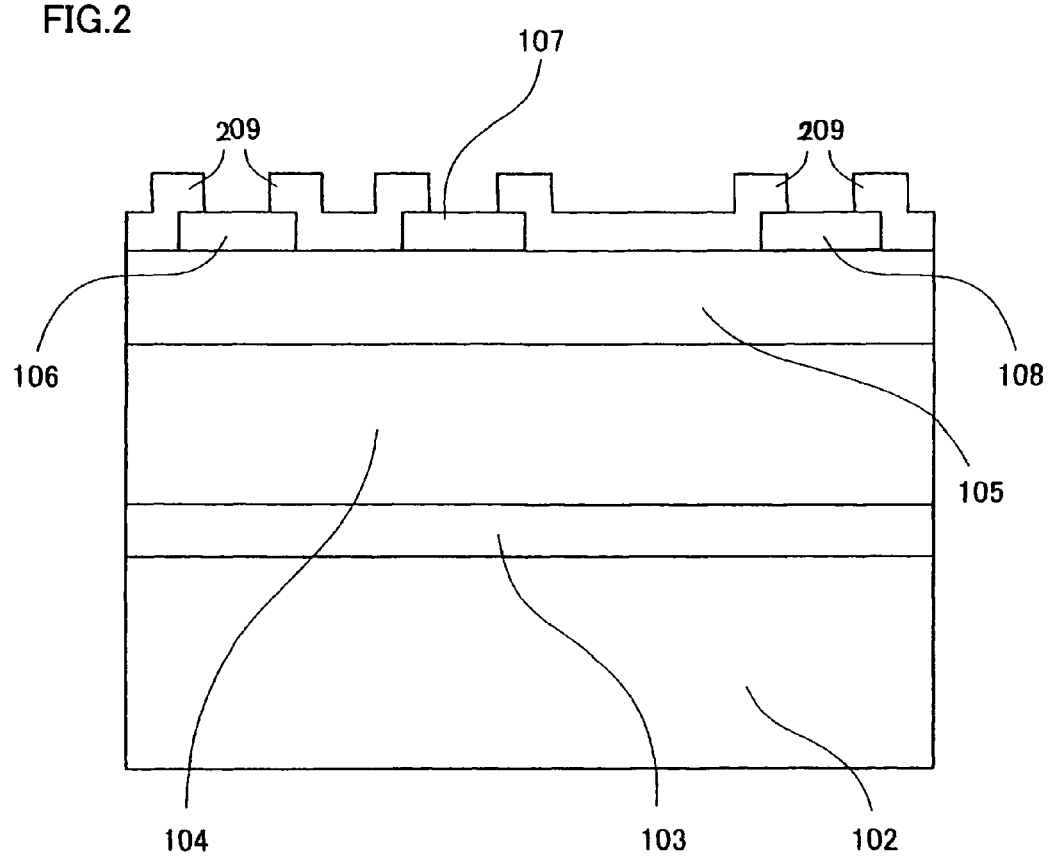
FIG. 2 is a schematic cross-sectional view of an HFET device according to another embodiment of the present invention.
Figure 3:
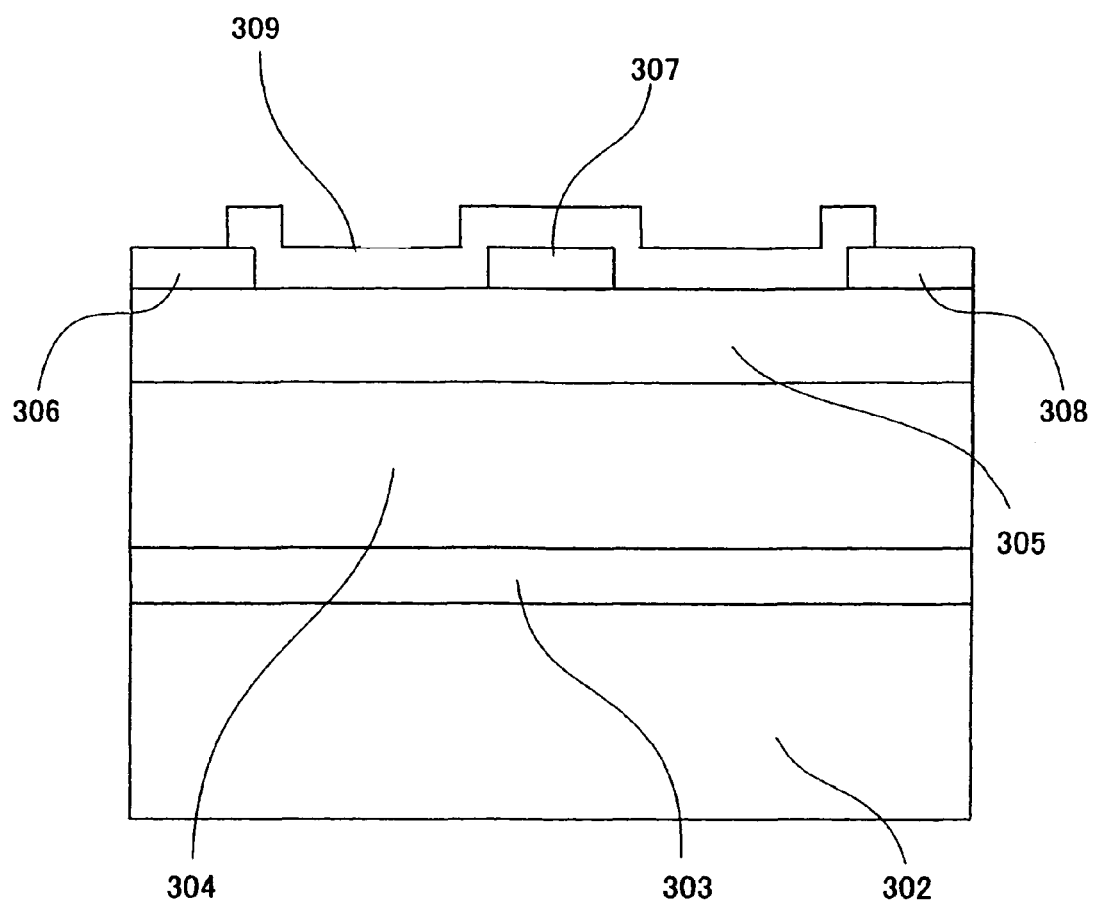
FIG. 3 is a schematic cross-sectional view of a conventional HFET device.

FIG. 2 shows a schematic cross-sectional view of a III-group nitride semiconductor HFET according to Example 2 of the present invention. This Example 2 differs from Example 1 only in that $SiO_2$ insulator layer 109 and hydrogen-absorbing $HfO_2$ layer 110 were integrated as an integrated layer 209. This integrated layer 209 had a thickness of 200 nm and was provided with openings in at least partial areas over source electrode 106, gate electrode 107 and drain electrode 108.

The concentration of the hydrogen-absorbing element Hf is graded inside integrated layer 209. More specifically, within integrated layer 209, the Hf concentration is lower on the AlGaN barrier layer side and increased on the upper surface side of integrated layer 209. By providing such concentration gradient, hydrogen atoms contained in integrated layer 209 are strongly attracted to the upper surface side of integrated layer 209 and then diffusion thereof toward the interior of the semiconductor device is suppressed.

Therefore, defects due to dissociation of hydrogen atoms are not formed inside integrated layer 209 and then it is possible to prevent the 2DEG formed in the vicinity of the hetero junction interface between AlGaN barrier layer 105 and i-type GaN channel layer 104 from being compensated by hydrogen atoms. As a result, it is possible to avoid decrease of the 2DEG concentration and increase of resistance of the current channel and then it becomes possible to suppress increase of the on-resistance during current operation of the HFET device.

The current test was also conducted on the HFET device of Example 2, under the same condition as that in Example 1. As a result, it was found that the III-group nitride semiconductor HFET device of Example 2 also showed a source-drain current value varied by a few % from the initial value even after 1000 hours of the driving and could stably operate for a long-term period.

Incidentally, it will be readily understood by a person skilled in the art that the HFET device of the structure as described above can be produced with utilizing various well-known methods for growing nitride semiconductor crystals. Specifically, each semiconductor layer included in the HFET device can be deposited with an MOCVD (metal organic chemical vapor deposition) method or an MBE (molecular beam epitaxy) method. The metal layers included in the source, gate and drain electrodes, and the protective layer can be deposited with any of commonly-used film deposition methods such as an electron beam evaporation method, a radio-frequency sputtering method, and various chemical vapor deposition (CVD) methods.

The above Examples showed the HFET device utilizing III-group nitride semiconductor as semiconductor material. As already explained in the presumed model, however, it is considered that the decrease in the source-drain current is caused by increase of defects inside the insulator layer, due to migration or diffusion of hydrogen atoms from the insulator layer on the upper side of the device toward the semiconductor layer side. Therefore, the semiconductor material is not limited to III-group nitride semiconductor, and the present invention is also effective to an HFET utilizing indium-gallium-aluminum-arsenide-based III-V-group compound semiconductor. For example, the present invention is also preferably applicable to a III-V-group compound semiconductor device including a GaAs channel layer and an AlGaAs barrier layer.

The above Examples showed the HFET device as the semiconductor device. As described above, however, migration or diffusion of hydrogen atoms finally influences the 2DEG in the vicinity of the hetero-interface inside the semiconductor layers. Therefore, the present invention is also effective to any of the semiconductor devices having a structure in which the 2DEG can be formed.

In Examples 1 and 2, $SiO_2$ was shown as a material for the insulator layer, and Hf was shown as a hydrogen-absorbing metal element. However, it is also possible to use Si, $Si_3N_4$, $TiO_2$, $ZrO_2$, $HfO_2$, $MgF_2$, $CaF_2$, $SrF_2$, $BaF_2$, $Al_2O_3$, $V_2O_5$, $Nb_2O_5$, $Ta_2O_5$, AlON, ZnO, or a mixture thereof for the insulator layer, and it is also possible to use Li, Na, Mg, K, Ca, Sc, Ti, Rb, Sr, Y, Zr, Cs, Ba, La, Ta, Ce, Pr, Nd, Sm, Eu, Gd, Tb, Dy, Ho, Er, and a compound thereof as the hydrogen-absorbing metal element. Regarding the combination of the metal element included in the insulator layer and the hydrogen-absorbing metal element, the effect of the present invention can be obtained by selecting the former and latter metal elements such that the latter has a smaller heat of formation of a hydride as compared with the former.

The concentration of hydrogen atoms contained in the insulator layer in each of Examples 1 and 2 was measured with SIMS. As a result, it was found that the insulator layer contains hydrogen atoms at a concentration of at least $1\times10^{18}/cm^3$.

According to the present invention as described above, it is possible to provide an improved III-V-group compound semiconductor device in which the on-resistance is not increased during a long-term period of operation. The III-V-group semiconductor device as above corresponds to various III-V-group semiconductor devices having a structure utilizing the 2DEG in a current path, centering on a field effect transistor. During operation of the device, diffusion of hydrogen atoms into the semiconductor layers can be suppressed and then variation of the device characteristics can be suppressed.

Although the present invention has been described and illustrated in detail, it is clearly understood that the same is by way of illustration and example only and is not to be taken by way of limitation, the scope of the present invention being interpreted by the terms of the appended claims.

What is claimed is:

1. A III-V-group compound semiconductor device comprising,
    a substrate,
    a channel layer provided over said substrate,
    a barrier layer provided on said channel layer so as to form a hetero-interface,
    a plurality of electrodes provided on said barrier layer,
    an insulator layer provided to cover an entire upper surface of said barrier layer except for at least partial regions of said electrodes, the insulator layer partially overlapping top surfaces of said electrodes,
    a hydrogen-absorbing layer stacked on said insulator layer or an integrated layer in which the hydrogen-absorbing layer is integrated with said insulator layer, the hydrogen-absorbing layer covering the entire upper surface of the barrier layer except for the at least partial regions of the electrodes, the hydrogen-absorbing layer partially overlapping the top surfaces of the electrodes.

2. The III-V-group compound semiconductor device according to claim 1, wherein each of said channel layer and barrier layer is formed with III-V-group compound semiconductor.

3. The III-V-group compound semiconductor device according to claim 2, wherein each of said channel layer and barrier layer is formed with III-group nitride semiconductor.

4. The III-V-group compound semiconductor device according to claim 1, wherein a metal element contained in said hydrogen-absorbing layer has a smaller heat of formation of a hydride as compared to a metal element contained in said insulator layer.

5. The III-V-group compound semiconductor device according to claim 1, wherein said insulator layer includes a dielectric selected from a group consisting of Si, $Si_3N_4$, $SiO_2$, $TiO_2$, $ZrO_2$, $HfO_2$, $MgF_2$, $CaF_2$, $SrF_2$, $BaF_2$, $Al_2O_3$, $V_2O_5$, $Nb_2O_5$, $Ta_2O_5$, AlON, and ZnO.

6. The III-V-group compound semiconductor device according to claim 1, wherein said hydrogen-absorbing layer is formed of one of a metal oxide, a metal nitride and a metal fluoride containing a metal element selected from a group consisting of Li, Na, Mg, K, Ca, Sc, Ti, Rb, Sr, Y, Zr, Cs, Ba, La, Hf, Ta, Ce, Pr, Nd, Sm, Eu, Gd, Tb, Dy, Ho, and Er.

7. The III-V-group compound semiconductor device according to claim 1, wherein said insulator layer contains hydrogen atoms at a concentration of $10^{18}/cm^3$ or more.

8. The III-V-group compound semiconductor device according to claim 1, wherein said hydrogen-absorbing layer has a thickness of 1 nm or more.

9. The III-V-group compound semiconductor device according to claim 1, wherein portions of the top surfaces of the plurality of electrodes are exposed by the insulator layer and the hydrogen-absorbing layer.

10. The III-V-group compound semiconductor device according to claim 1, wherein a thickness of the insulator layer is less than a thickness of the plurality of electrodes.

11. The III-V-group compound semiconductor device according to claim 1, wherein the plurality of electrodes includes a source electrode, a gate electrode, and a drain electrode, a first surface area of the insulator layer between the source electrode and the gate electrode being smaller than a second surface area of the insulator layer between the gate electrode and the drain electrode.

12. The III-V-group compound semiconductor device according to claim 1, wherein the hydrogen-absorbing layer does not contact the plurality of electrodes.

13. The III-V-group compound semiconductor device according to claim 1, wherein the hydrogen-absorbing layer is confined to a top surface of the insulator layer.

* * * * *